US012570266B2

(12) United States Patent
Hebda et al.

(10) Patent No.: US 12,570,266 B2
(45) Date of Patent: Mar. 10, 2026

(54) AUTOMOTIVE ELECTRONIC CONTROL UNIT

(71) Applicant: Aptiv Technologies AG, Schaffhausen (CH)

(72) Inventors: Pawel Hebda, Cracow (PL); Robert Lis, Cracow (PL)

(73) Assignee: APTIV TECHNOLOGIES AG, Schaffhausen (CH)

( * ) Notice: Subject to any disclaimer, the term of this patent is extended or adjusted under 35 U.S.C. 154(b) by 126 days.

(21) Appl. No.: 18/443,846

(22) Filed: Feb. 16, 2024

(65) Prior Publication Data

US 2025/0229763 A1 Jul. 17, 2025

(30) Foreign Application Priority Data

Jan. 11, 2024 (EP) ..................................... 24151418

(51) Int. Cl.
| | |
|---|---|
| *B60W 10/20* | (2006.01) |
| *B60W 10/04* | (2006.01) |
| *H05K 1/02* | (2006.01) |
| *H05K 3/36* | (2006.01) |

(52) U.S. Cl.
CPC ............ *B60W 10/20* (2013.01); *B60W 10/04* (2013.01); *H05K 1/0219* (2013.01); *H05K 3/368* (2013.01); *H05K 2201/0707* (2013.01)

(58) Field of Classification Search
CPC .... B60W 10/20; B60W 10/04; H05K 1/0219; H05K 3/368; H05K 2201/0707; H05K 1/144; H05K 9/0022; H05K 9/0035; H05K 9/0032
See application file for complete search history.

(56) References Cited

U.S. PATENT DOCUMENTS

| | | | | |
|---|---|---|---|---|
| 2008/0142571 | A1* | 6/2008 | Yokozuka | H05K 1/144 |
| | | | | 228/110.1 |
| 2009/0135576 | A1* | 5/2009 | Chao | H05K 1/144 |
| | | | | 361/816 |
| 2020/0344924 | A1* | 10/2020 | Harrigan | H05K 1/144 |

FOREIGN PATENT DOCUMENTS

| | | |
|---|---|---|
| CN | 112153809 B | 4/2022 |

OTHER PUBLICATIONS

Extended European Search Report regarding European Patent Application No. 24151418.1, dated Jul. 17, 2024.

* cited by examiner

*Primary Examiner* — Alan D Hutchinson
(74) *Attorney, Agent, or Firm* — Harness, Dickey & Pierce, P.L.C.

(57) ABSTRACT

An automotive electronic control unit comprising a first circuit board, a second circuit board and a shielding wall, comprising an electromagnetic shielding material, wherein the first circuit board and the second circuit board together with the shielding wall form a shielded space arranged between the first and the second circuit boards, wherein an electric component arranged at least one of the first or second circuit board is within the shielded space.

15 Claims, 4 Drawing Sheets

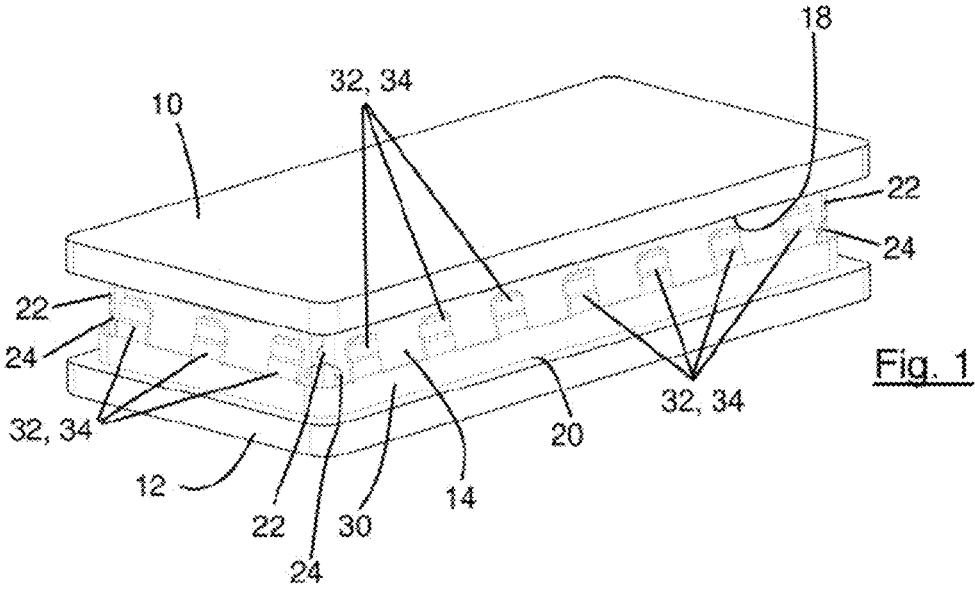
_Fig. 1_
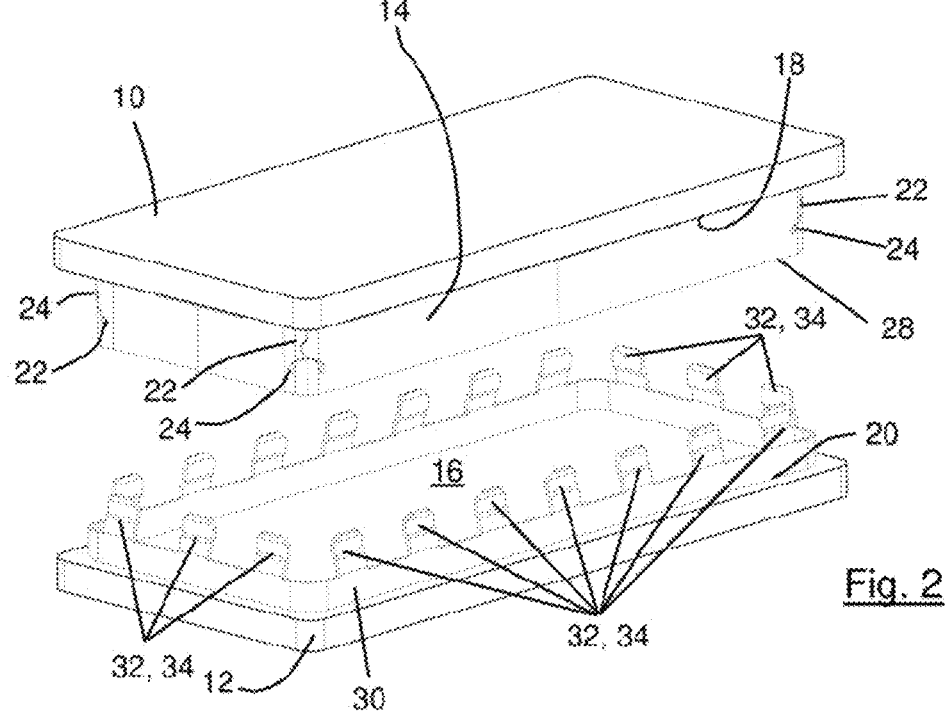
_Fig. 2_

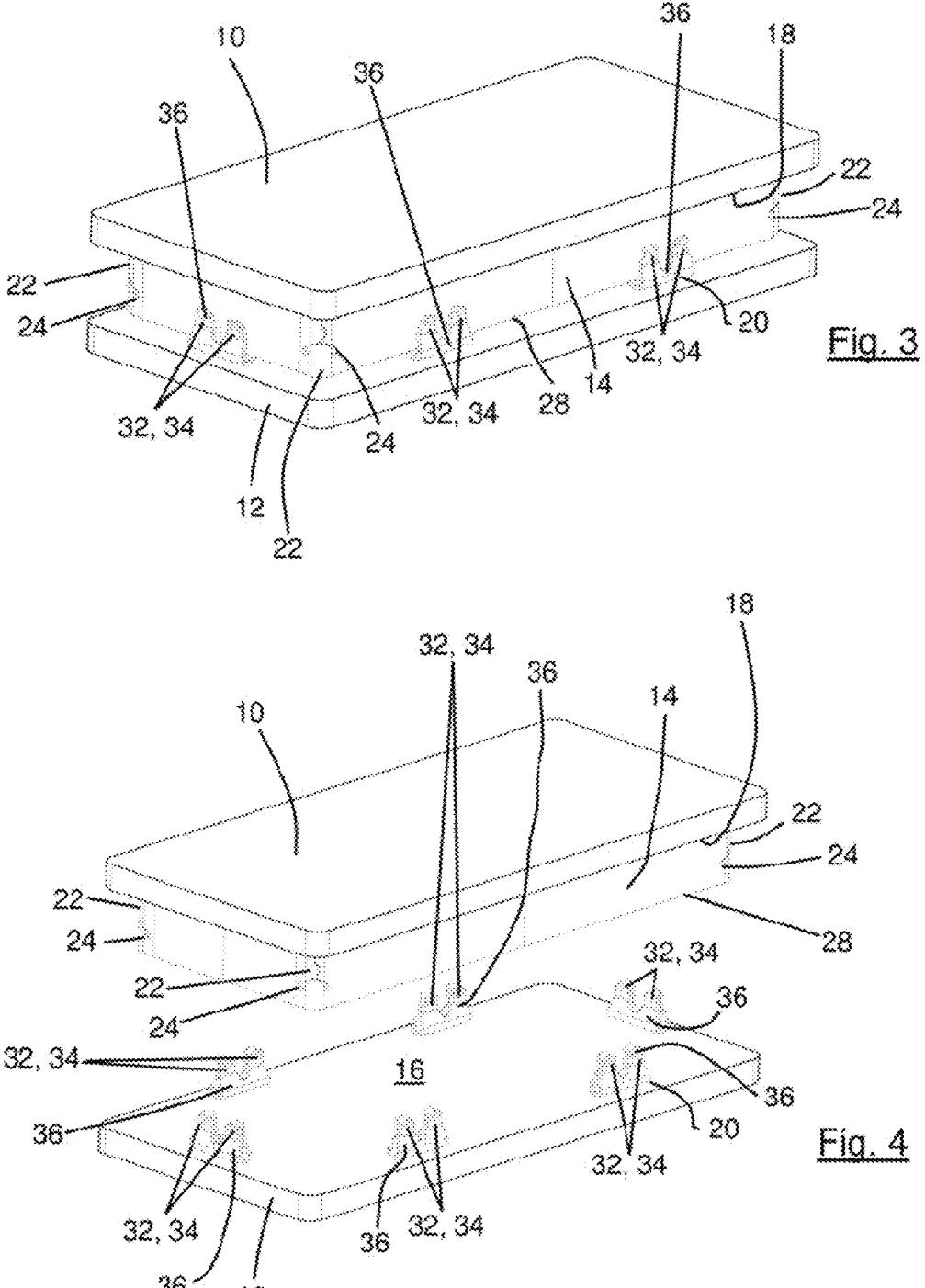
_Fig. 3_
_Fig. 4_

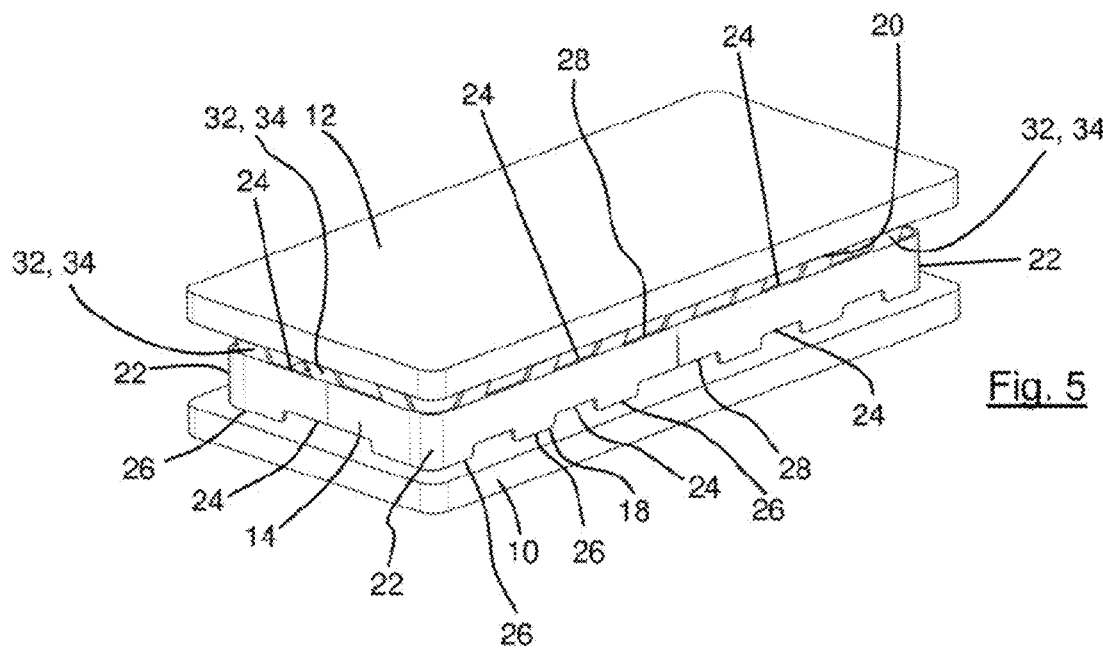
_Fig. 5_
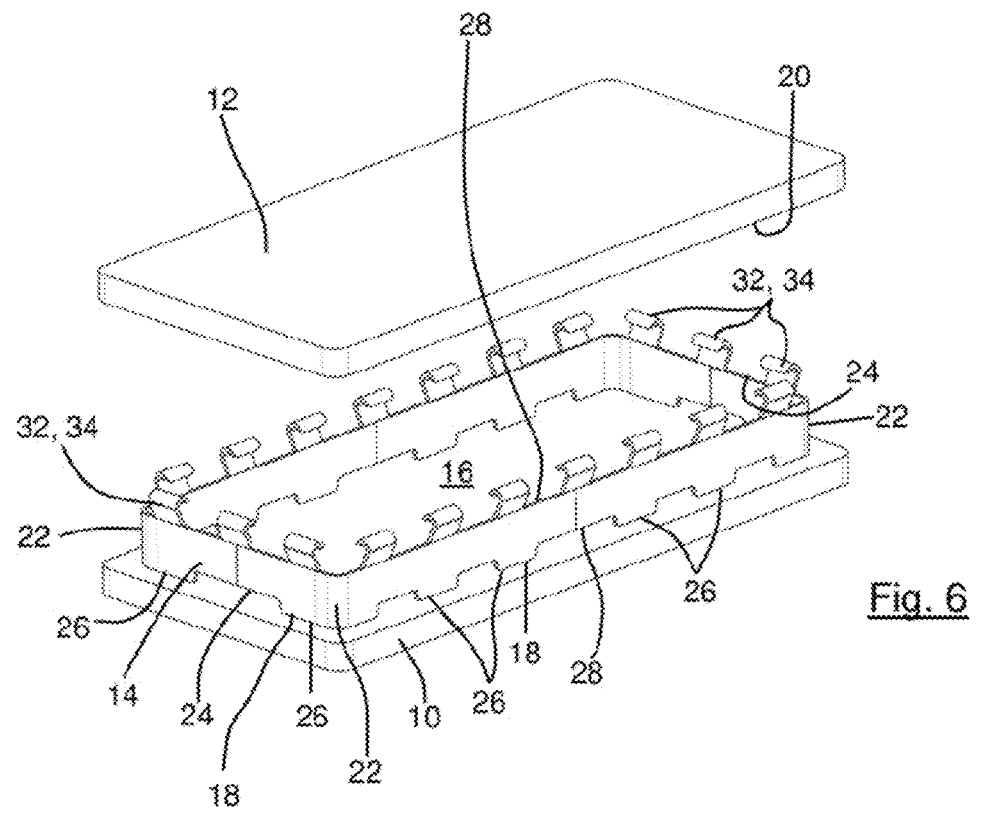
_Fig. 6_

AUTOMOTIVE ELECTRONIC CONTROL UNIT

CROSS-REFERENCE TO RELATED APPLICATIONS

This application claims the benefit and priority of European patent application number 24151418.1, filed on Jan. 11, 2024. The entire disclosure of the above application is incorporated herein by reference.

FIELD

This section provides background information related to the present disclosure which is not necessarily prior art.

The present disclosure is directed at an automotive electronic control unit comprising at least one circuit board.

BACKGROUND

Such kind of electronic control unit (also known as ECU) is well known in the art and can be used in a vehicle for a plethora of applications. Typical examples of devices controlled by an electronic control unit are a motor, a steering device, a door locking system, devices for autonomous driving and the like.

In order to avoid electromagnetic interference with other electronic components, the electronic control unit generally comprises an electromagnetic shielding which electromagnetically shields at least some of the electronic components of the circuit board.

A typical electromagnetic shielding may be formed for example by a shielding cover connected to the circuit board and covering the electronic components to be shielded. The shielding cover may comprise a cover plate on a side opposite to the circuit board.

However, such a design of the electromagnetic shielding requires the assembly of multiple parts which increases assembly effort and cost.

It is therefore desired to facilitate the assembly of an automotive electronic control unit.

SUMMARY

This section provides a general summary of the disclosure, and is not a comprehensive disclosure of its full scope or all of its features.

An automotive electronic control unit comprising a simplified setup is achieved with the features of claim 1.

The setup of the automotive electronic control unit can be simplified on the basis of the idea that, in an automotive electronic control unit comprising two circuit boards, the already available circuit boards are used to cover the electromagnetic shielding wall from both sides. In other words, one of the circuit boards is used instead of a cover plate to cover an electromagnetic shielding wall connected to the other circuit board. The circuit boards together with the electromagnetic shielding wall form a shielded space arranged between the circuit boards, wherein the shielded space accommodates an electronic component arranged on at least one of the circuit boards. The first and second circuit boards as well as the electromagnetic shielding wall therefore define boundaries of the shielded space. Thus, the need of an additional cover plate is eliminated.

As a consequence, the automotive electronic control unit is simplified as less parts are required for its assembly, which also has a beneficial impact on cost reduction.

Furthermore, by connecting the circuit boards to the electromagnetic shielding wall, the overall size of the automotive electronic control unit can be reduced. The resulting compact design of the automotive electronic control unit, which may be also referred to as control unit hereinafter, enables the use of the automotive electronic control unit in a limited space environment. However, at the same time, a space for component placement on the circuit boards is increased.

Further advantages become apparent from the description, the dependent claims and the accompanying drawings.

Particularly, the first circuit board and the second board may each comprise a layer of an electromagnetic shielding material.

An electromagnetic shielding material may be selected for example from at least one of copper, nickel, silver, iron, tin or alloys thereof, such as brass or steel, in particular a spring steel.

Sufficient electromagnetic shielding may be achieved if the shielding wall and/or the shielding layer is formed as a whole piece, allowing for a cost-efficient production of the shielding wall and/or the shielding layer.

However, sufficient electromagnetic shielding may be also achieved if the shielding wall and/or the shielding layer is perforated. Such kind of perforation reduces weight and may save material. Preferably, the shielding wall and/or the shielding layer may be perforated in a manner to form a mesh.

The perforation of the shielding wall and/or the shielding layer may form a cavity or an opening. Preferably, the cavity formed in the shielding wall and/or the shielding layer may have a maximum opening size of at least 1 mm, preferably of at least 2 mm and most preferably of at least 5 mm. Such size of the cavity still allows for a sufficient electromagnetic shielding.

It is further noted that the cavity or opening may also refer to a space formed between two protrusions projecting from a rim of the shielding wall and/or the shielding layer.

Preferably, the shielding wall is formed of a bent sheet of metal, in particular a stamped and bent sheet of metal, which allows for an easy and cost-efficient production of the shielding wall.

The shielding wall may be physically connected to the respective circuit boards to form a stable setup of the automotive electronic control unit.

Furthermore, the shielding wall may be electrically connected to the respective shielding layers of the first circuit board and the second circuit board.

In order to connect the shielding wall to the respective circuit boards, the first circuit board and the second circuit board respectively may comprise a connecting side, with the shielding wall being connected to the first circuit board and the second circuit board at the respective connecting sides.

The connecting sides of the circuit boards may also serve as an electrical contact between the respective shielding layers of the circuit boards and the shielding wall.

The shielding wall may be connected to the respective circuit boards at the connecting sides by means of at least one of form fit, force fit and material bond, in particular the material bond comprising soldering.

The shielding wall may be connected to the first circuit board and the second circuit board in the same manner or in a different manner. In particular, the shielding wall may be connected to the first circuit board as well as the second circuit board in the same manner by means of either one of material bond and force fit. Alternatively, the shielding wall and the first circuit board may be connected by means of material bond, whereas the shielding wall and the second circuit board may be connected by force fit.

A force fit connection may be achieved by at least one spring elastic connection means. The spring elastic connection means may be formed as a spring arm protruding from a rim of the shielding wall. In an assembled state of the automotive electronic control unit, the spring arm may be received in a corresponding hole formed at the connecting side of the circuit board.

However, the spring elastic connection means can also comprise at least one retention clip attached to the circuit board, thereby forming a connection side for the shielding wall. In particular, the retention clip may comprise two spring arms, wherein, in an assembled state of the control unit, the shielding wall is received between the spring arms of the retention clip.

Furthermore, the spring elastic connection means may be formed by a retention wall at least partially surrounding the shielding wall or being at least partially surrounded by the shielding wall. At least one spring arm formed at the retention wall bears against the shielding wall, when the shielding wall is connected to the retention wall. Preferably, the spring arm of the retention wall may bear against an outer surface of the shielding wall, if the retention wall surrounds the shielding wall. However, the spring arm of the retention wall may bear against an inner surface of the shielding wall, if the shielding wall surrounds the retention wall.

According to one embodiment, the shielding wall comprises at least one protrusion extending from the rim facing towards the circuit board to which the shielding wall is connected. The protrusion may be received in a corresponding hole formed at the connecting side of the circuit board. Furthermore, the protrusion of the shielding wall received in the hole of the circuit board may be fixed by material bond. By means of example the protrusion received in the hole may be fixed by soldering.

Generally speaking, the shielding wall may be mounted to at least one of the first circuit board and the second circuit board by means of at least one hole formed at the respective connecting side.

Additionally or alternatively, the shielding wall may be mounted to at least one of the first circuit board and the second circuit board by means of at least one spring element, in particular the spring element bearing against the shielding wall.

It is noted that shielding wall may be electrically connected to the respective shielding layer by means of the hole and/or the spring element present at the connecting side of the respective circuit board.

According to one embodiment, the shielding wall may be formed as a single piece. allowing for a cost efficient production of the shielding wall.

According to another embodiment, the shielding wall comprises at least a first wall section and a second wall section, with the first wall section connected to the first circuit board and the second wall section connected to the second circuit board.

This allows for an easy pre-assembly of the wall sections of the shielding wall to the respective circuit boards, such that the shielding wall is formed, when the circuit boards are combined. Furthermore, the separate wall sections allow an easy access to the electronic components, when the circuit boards are disassembled. This is advantageous for the assembly of the electronic components as well as for maintenance purposes.

In order to provide for a sufficient electromagnetic shielding, the first wall section may surround, in particular circumferentially surround, at least a part of the second wall section.

In an assembled state, the first wall section and the second wall section may contact each other. However, according to another embodiment, the first wall section and the second wall section may be free of contact, in particular free of electrical contact.

Preferably, the first circuit board and the second circuit board of the control unit are arranged parallel to each other, in particular with the respective connecting sides facing each other. In such kind of configuration, a distance between the circuit boards connected by the shielding wall may range between 1 to 10 mm, preferably between 2 to 8 mm and for example between 3 to 5 mm.

It is to be noted that the shielding wall may be also shaped such that the first circuit board and the second circuit board may be arranged at an angle to each other, for example at an angle of 90°.

Preferably, the automotive electronic control unit may be used to control parts of a vehicle, in particular a motor, a steering device. However, the automotive electronic control unit disclosed herein, may be also used to control other parts of the car, such as but not limited to a door locking system, a human-machine interface, telecommunication devices, a power train, a velocity control, a brake module, a battery management system, devices for autonomous driving and the like.

The electronic component to be shielded may be selected of at least one of a processor, a processing unit, at least one memory unit and at least one non-transitory data storage. However, other electronic components may be shielded, as well.

Furthermore, the automotive electronic control unit may comprise a camera. Preferably, the camera is provided at one of the first and second circuit boards, in particular on a side of the respective first and second circuit boards that is opposite to the shielding wall. In particular, the camera may be arranged on a side of the respective first and second circuit boards forming an outside of the automotive electronic control unit, such that the camera faces towards the outside thereof.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Exemplary embodiments and functions of the present disclosure are described herein in conjunction with the following drawings, showing schematically:

FIG. 1 is an illustration of a perspective view of an automotive electronic control unit according to a first embodiment.

FIG. 2 is an illustration of a perspective partial exploded view of the control unit of FIG. 1.

FIG. 3 is an illustration of a perspective view of an automotive electronic control unit according to a second embodiment.

FIG. 4 is an illustration of a perspective partial exploded view of the control unit of FIG. 3.

FIG. 5 is an illustration of a perspective view of an automotive electronic control unit according to a third embodiment;

FIG. 6 is an illustration of a perspective partial exploded view of the control unit of FIG. 5.

Corresponding reference numerals indicate corresponding parts throughout the several views of the drawings.

DETAILED DESCRIPTION

Figure 7:
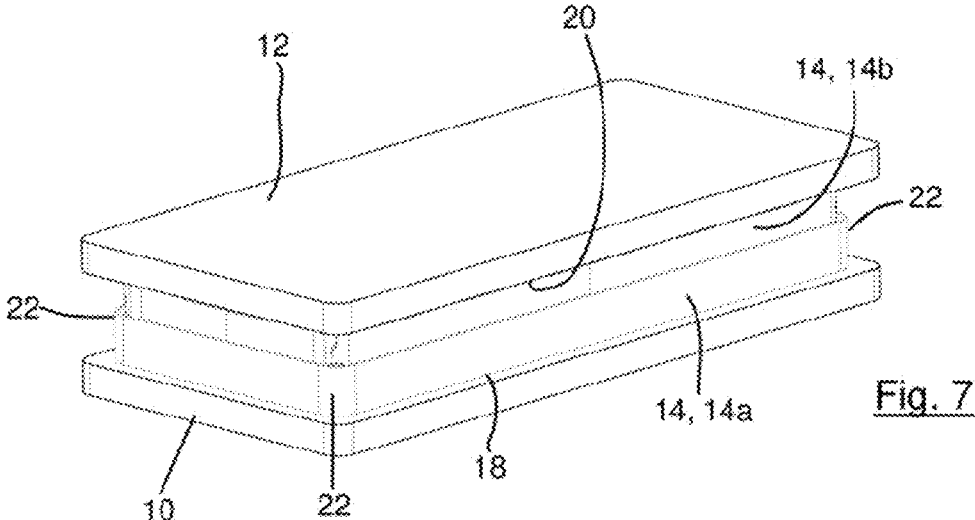
FIG. 7 is an illustration of a perspective view of an automotive electronic control unit according to a fourth embodiment.

Example embodiments will now be described more fully with reference to the accompanying drawings.

In the drawings various embodiments of an automotive electronic control unit are shown. The automotive electronic control unit which may be also shortly referred to as control unit may be used to control parts of a vehicle, for example a motor or a steering device.

Each of the control units described hereinafter comprises a first circuit board 10 and a second circuit board 12.

At least one of the circuit boards 10, 12 comprises an electronic component to be electromagnetically shielded. In the drawings the electronic component is not shown for the sake of simplicity.

The electronic component may be at least one selected of a processor, a processing unit, at least one memory unit or at least one non-transitory data storage.

For the purpose of electromagnetic shielding, the control unit comprises an electromagnetic shielding wall 14 which together with the first circuit board 10 and the second circuit board 12 forms a shielded space 16 (FIGS. 2, 4, 6 and 8).

The shielded space 16 is arranged between the first and the second circuit boards 10, 12 and an inside of the shielding wall 14.

Furthermore, the shielded space 16 accommodates the electronic component of at least one of the first and second circuit boards 10, 12.

The shielding wall 14 of the embodiments shown in the drawings comprises an electromagnetic shielding material and is made of a stamped and bent sheet of metal, such as for example copper, nickel, silver, iron, tin or alloys thereof, like brass or steel, in particular a spring steel.

Furthermore, the material forming the circuit boards 10, 12 may also be capable of electromagnetic shielding. However, to enhance the electromagnetic shielding properties of the circuit boards 10, 12, the circuit boards 10, 12 may comprise a shielding layer (not shown) of an electromagnetic shielding material.

The electromagnetic shielding material of the shielding layer may be the same as the electromagnetic shielding material used for the shielding wall 14. Alternatively, different electromagnetic shielding materials may be used for the shielding layers and the shielding wall 14. In this context, it is noted that electromagnetic shielding materials used for the shielding layers of the respective circuit boards 10, 12 may be the same or different.

As will be described in further detail below with regard to the specific embodiments, the shielding wall 14 is connected to the circuit boards 10, 12 at connecting sides 18, 20 respectively formed at the circuit boards 10, 12.

The connecting sides 18, 20 are further used to electrically connect the shielding wall 14 to the respective shielding layers of the first and second circuit boards 10, 12. It is to be understood, that, in this case, the connecting sides 18, 20 are electrically conductive and electrically connected to the respective shielding layers.

As can be seen from FIGS. 1, 3, 5, 7 and 8, in an assembled state of the control unit, the circuit boards 10, 12 are arranged parallel to each other, such that the connecting sides 18, 20 face each other.

in such a configuration, a distance the circuit boards 10, 12 connected by the shielding wall 14 ranges between 1 to 40 mm, preferably between 4 to 20 mm and for example between 8 to 16 mm.

However, depending on the application other arrangements of the circuit boards 10, 12 may be envisaged, in which the circuit boards 10, 12 are arranged at an angle to each other. For example, the first circuit board 10 may be arranged at an angle of 20°, 45° or 90° with regard to the second circuit board 12. It is to be understood that the shielding wall 14 is then formed such that the first circuit board 10 is connected to the second circuit board 12 by means of the shielding wall 14, thereby forming a corresponding shielded space 16.

Now turning to FIGS. 1 and 2 a first embodiment of the control unit will be described.

The shielding wall 14 is formed as a single piece of bent sheet of metal. In particular, the shielding wall 14 is formed as a substantially whole piece only being perforated at respective bent corners 22 of the shielding wall 14.

The perforations at the corners 22 form V-shaped cavities 24 facilitating the bending of the sheet metal at the respective corners.

However, the shielding wall 14 may comprise further cavities. In particular the shielding wall 14 may be perforated in segments such as to form a mesh. In this regard it is noted that a maximum size of the cavities 24 and/or the cavities of the mesh may have a maximum opening size of at least 1 mm, preferably of at least 2 mm and most preferably of at least 5 mm.

The shielding wall 14 of the first embodiment is connected to the first circuit board 10 by means of material bond, such as soldering.

For this purpose, the shielding wall 14 comprises protrusions 26 projecting from a rim 28 of the shielding wall as can be best seen in FIG. 5 shown in connection with a control unit according to a third embodiment.

The protrusions 26 are received in corresponding holes (not shown) formed in the first circuit board 10. In this context, the holes define the connecting side 18 of the first circuit board 10.

In order to mount the shielding wall 14 to the first circuit board 10, the protrusions 26 are inserted into the holes. The holes are subsequently filled with a solder material to material bond the shielding wall 14 to the first circuit board 10.

On an opposite side, the shielding wall 14 is connected to the second circuit board 12 by means of a retention wall 30 connected to the second circuit board 12.

The retention wall 30 comprises multiple spring elements 32 formed as spring arms 34 protruding away from the retention wall 30 on a side of the retention wall 30 opposite to the side facing the second circuit board 12. In other words, the spring arms 34 protrude towards the first circuit board 10 in an assembled state of the control unit.

In an assembled state, the shielding wall 14 is circumferentially surrounded by the retention wall 30, such that the spring arms 34 of the retention wall 30 bear against an outer surface of the shielding wall 14, thereby connecting the shielding wall 14 to the second circuit board 12 at its connecting side 20 by means of force fit. In this context, it is noted that the spring arms 34 are inwardly inclined.

It is further noted that the retention wall 30 may also be surrounded by the shielding wall 14, such that in an assembled state of the control unit, the outwardly inclined spring arms 34 bear against an inner surface of the shielding wall 14.

The retention wall 30 can be a part of the shielding wall 14.

In order to lie flush at the second circuit board, the rim 28 of the shielding wall 14 facing towards the second circuit board 12 is even (FIG. 2).

It is noted that the shielding wall 14 may be connected to either one of the first and second circuit boards 10, 12 in the same manner, i.e. the shielding wall 14 may be connected to both circuit boards 10, 12 by either the above described material bond or the above described force fit.

Now turning to FIGS. 3 and 4 a second embodiment of the control unit is described. The control unit according to the second embodiment basically corresponds to the control unit of the first embodiment.

However, the shielding wall 14 of the control unit of the second embodiment is not connected to the second circuit board 12 by means of the retention wall 30, but rather by means of multiple retention clips 36 connected to the second circuit board 12 and defining the connecting side 20 of the second circuit board 12.

In the present embodiment, the second circuit board 12 comprises six retention clips 36 (FIG. 4). In particular, respectively two retention clips 36 are provided for each long side of the shielding wall 14 and respectively one retention clip 36 is used for each short side of the shielding wall 14. However, depending on the application of the control unit and/or the size of the shielding wall 14, the number of retention clips 36 may be more or less than six, such as two, three, four, five, seven or more retention clips 36.

As can be seen from FIG. 4, each retention clip 36 comprises two pairs of spring arms 34, with the shielding wall 14 being received between two spring arms 34 of a pair of spring arms 34 in an assembled state of the control unit (FIG. 3). In this context, the retention clips 36 are another example of a spring element 32 used to connect the shielding wall 14 to the circuit boards 10, 12 by means of force fit.

It is noted that the shielding wall 14 may be respectively connected to each of the first and second circuit boards 10, 12 by means of the retention clips 36. Additionally, the hielding wall 14 may be connected at least in sections to at least one of the first and second circuit boards 10, 12 by means of the retention wall 30 as described with regard to the first embodiment.

A third embodiment of a control unit is described with regard to FIGS. 5 and 6. The control unit of third embodiment basically corresponds to the control unit according to the first embodiment, except for the manner how the shielding wall 14 is connected to the second circuit board 12.

In the control unit of the third embodiment, the spring element 32 is not formed at the second circuit board 12, as described with regard to the first and second embodiments, but the spring element 32 is formed at the shielding wall 14. In particular, the shielding wall 14 comprises multiple spring arms 34 projecting away from a rim 38 of the shielding wall opposite to the rim 38 of the shielding wall 14 comprising the protrusions 26 used for material bonding the shielding wall 14 to the first circuit board 10.

In an assembled state of the control unit, the spring arms 34 are received in corresponding holes (not shown) present in the second circuit board 12, thereby connecting the shielding wall 14 to the second circuit board 12 by means of force fit. In this regard, the holes form the connecting side 20 of the second circuit board 12.

As can be seen from FIG. 6, each of the spring arms 34 projects outwardly and comprises an arcuate free end. Such kind of configuration facilitates the insertion of the spring arms 34 into the respective holes at the connecting side 20 of the second circuit board 12. It is noted that the spring arm 34 may also have another configuration, in particular, the spring arms 34 may project inwardly.

Furthermore, in order to provide the spring arms 34 with sufficient spring elastic force, the shielding wall 14 may be made of a spring steel.

It is further noted that a cavity formed by a space between adjacent spring arms 34 may have a maximum opening size of at least 1 mm, preferably of at least 2 mm and most preferably of at least 5 mm.

Figure 8:
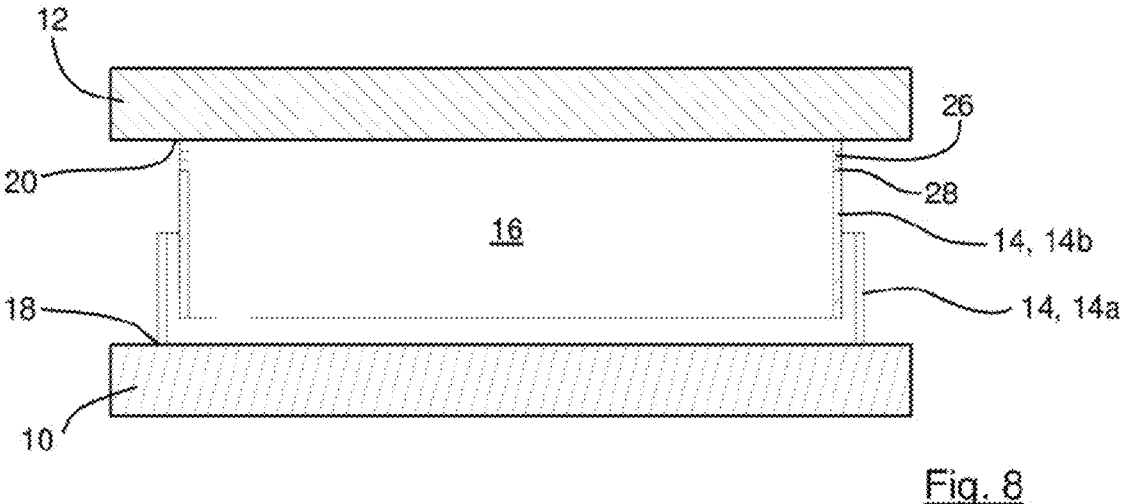
FIG. 8 is an illustration of a cross-sectional view of the control unit of FIG. 7.

Now turning to FIGS. 7 and 8, a fourth embodiment of a control unit is described.

The control unit of the fourth embodiment has a shielding wall 14 which comprises at a first wall section 14*a* and a second wall section 14*b*.

The first wall section 14*a* is connected to the first circuit board 10, whereas the second wall section 14*b* is connected to the second circuit board 12.

In particular, the first wall section 14*a* is connected to the first circuit board 10 by means of material bond, as is described in the context of the first embodiment with regard to the material bonding of the shielding wall 14 to the first circuit board 10.

The second wall section 14*b* is connected to the second circuit board 12 by means of material bond in a similar manner as the first wall section 14*a* is connected to the first circuit board 10.

It is to be understood that at least one of the first wall section 14*a* and the second wall section 14*b* may be connected to the corresponding circuit board 10, 12 by means of force fit as described above with regard to the first to third embodiments. It is to be understood that the wall sections 14*a*, 14*b* and/or the connecting sides 18, 20 are then configured in a corresponding manner.

As can be further seen from FIG. 7, in an assembled state of the control unit, the the first wall section 14*a* entirely circumferentially surrounds the second wall section 14*b*. However, the first wall section 14*a* may also surround the second wall section 14*b* only in sections.

Furthermore, as shown in the cross-sectional view of FIG. 8, in an assembled state of the control unit, the first wall section 14*a* and the second wall section 14*b* are free of contact, in particular free of electrical contact.

Even further, the first wall section 14*a* connected to the first circuit board 10 is free of contact with regard to the second circuit board 12. In a similar manner, the second wall section 14*b* connected to the second circuit board 12 is free of contact with regard to the first circuit board 10. This may be achieved for example by means of a spacer (not shown) arranged between the first and second circuit boards 10, 12.

REFERENCE NUMERAL LIST

10 first circuit board
12 second circuit board 14 shielding wall
14*a* first wall section
14*b* second wall section
16 shielded space
18 connecting side
20 connecting side
22 corner
24 cavity
26 protrusion
28 rim
30 retention wall
32 spring element
34 spring arm
36 retention clip

What is claimed is:

1. An automotive electronic control unit comprising:
a first circuit board;
a second circuit board; and
a shielding wall comprising an electromagnetic shielding material;
wherein the first circuit board and the second circuit board together with the shielding wall form a shielded space arranged between the first and the second circuit boards; and
wherein an electronic component arranged on at least one of the first or second circuit board is within the shielded space,
wherein the first circuit board and the second circuit board respectively comprise a connecting side and the shielding wall is connected to the first circuit board and the second circuit board at the respective connecting sides, and
wherein the shielding wall is mounted to at least one of the first circuit board and the second circuit board by at least one hole formed at the respective connecting side.

2. The automotive electronic control unit according to claim 1, wherein the first circuit board and the second circuit board each comprise a shielding layer of an electromagnetic shielding material.

3. The automotive electronic control unit according to claim 2, wherein the shielding wall is electrically connected to the respective shielding layers of the first circuit board and the second circuit board.

4. The automotive electronic control unit according to claim 1, wherein the shielding wall and/or the shielding layer comprises at least a segment that is perforated or a whole piece.

5. The automotive electronic control unit according to claim 4, wherein a cavity formed in the shielding wall and/or the shielding layer has a maximum opening size of at least 1 mm.

6. The automotive electronic control unit according to claim 4, wherein a cavity formed in the shielding wall and/or the shielding layer has a maximum opening size of at least 2 mm.

7. The automotive electronic control unit according to claim 4, wherein a cavity formed in the shielding wall and/or the shielding layer has a maximum opening size of at least 5 mm.

8. The automotive electronic control unit according to claim 1, wherein the shielding wall is formed of a stamped and bent sheet of metal.

9. The automotive electronic control unit according to claim 1, wherein the shielding wall is mounted to at least one of the first circuit board and the second circuit board by at least one spring element, the at least one spring element bearing against the shielding wall or the at least one spring element being received in the at least one hole formed at the connecting side.

10. The automotive electronic control unit according to claim 1, wherein the shielding wall is formed as a single piece.

11. The automotive electronic control unit according to claim 1, wherein the shielding wall comprises at least a first wall section and a second wall section, with the first wall section being connected to the first circuit board and the second wall section being connected to the second circuit board.

12. The automotive electronic control unit according to claim 11, wherein the first wall section circumferentially surrounds at least a part of the second wall section.

13. The automotive electronic control unit according to claim 11, wherein the first wall section and the second wall section are free of electrical contact in an assembled state of the automotive electronic control unit.

14. The automotive electronic control unit according to claim 1, wherein the automotive electronic control unit is used to control parts of a vehicle, including a motor and a steering device.

15. The automotive electronic control unit according to claim 1, wherein the electronic component includes a processor, a processing unit, at least one memory unit, and at least one non-transitory data storage.

* * * * *